United States Patent [19]

Arecchi et al.

[11] Patent Number: 5,197,075
[45] Date of Patent: Mar. 23, 1993

[54] APPARATUS AND METHOD FOR THE GENERATION OF MODULATED OPTICAL SIGNALS USING A SEMICONDUCTOR LASER

[75] Inventors: Fortunato T. Arecchi; Massimo Calzavara, Turni; Giovanni Giacomelli, Florence, all of Italy

[73] Assignee: Cselt - Centro Studi e Laboratori Telecomunicazioni S.p.A., Turin, Italy

[21] Appl. No.: 805,863

[22] Filed: Dec. 10, 1991

[30] Foreign Application Priority Data

Dec. 21, 1990 [IT] Italy .................. 68036 A/90

[51] Int. Cl.$^5$ ............................ H01S 3/10
[52] U.S. Cl. ........................ 372/28; 372/32; 372/38; 372/700; 372/43; 372/31
[58] Field of Search ............... 372/9, 16, 14, 20, 29, 372/31, 32, 38, 28, 43, 50, 109, 700

[56] References Cited

U.S. PATENT DOCUMENTS

| | | | |
|---|---|---|---|
| 3,774,120 | 11/1973 | Ross | 372/21 |
| 4,390,247 | 6/1983 | Freyre | 372/700 X |
| 4,638,483 | 1/1987 | Bowers | 372/28 X |
| 4,660,206 | 4/1987 | Halmos et al. | 372/21 |
| 4,665,524 | 5/1987 | Cotter | 372/38 X |
| 4,856,010 | 8/1989 | Wissman et al. | 372/32 |
| 4,884,280 | 11/1989 | Kinoshita | 372/38 |
| 4,907,237 | 3/1990 | Dahmani et al. | 372/32 |
| 4,958,354 | 9/1990 | Urakami et al. | 372/38 X |
| 4,998,256 | 3/1991 | Ohshima et al. | 372/38 X |
| 5,128,950 | 7/1992 | Tsuchiya et al. | 372/38 X |

FOREIGN PATENT DOCUMENTS 0206338 12/1986 European Pat. Off. ......... 372/38 X

OTHER PUBLICATIONS

Journal of Lightwave Technology, Oct. 1984, New York, pp. 719-773 Nakazawa et al., An Optoelectronic Self-Oscillatory Circuit With An . . . .
Electronics Letters Apr. 23, 1987, vol. 23, No. 9, Paulus et al. pp. 471-472.
Electronics Letters—Jun. 4, 1987, No. 12, vol. 23-N. A. Olsson pp. 659-660.
Giacomelli et al., "Instabilities in a Semiconductor Laser with Delayed Optoelectronic Back," Optics Communications, vol. 74 pp. 97-101.
Olshansky et al., "Subcarrier Multiplexed Lightwave Systems for Broadband Distribution," Journal of Lightwave Technology, vol. 7, pp. 1329-1341.

Primary Examiner—Brian Healy
Attorney, Agent, or Firm—Herbert Dubno

[57] ABSTRACT

A system for the generation of modulated optical signals, wherein to the d.c. bias current of a semiconductor laser (1) associated with an opto-electronic feedback circuit (2) including a delay, there are superimposed the variations of a current obtained by detecting an optical signal resulting from the combination of an optical, amplitude-modulated input signal and of the optical signal present in the feedback circuit. By a suitable choice of the modulation frequency (f2) of the input signal and of the low-frequency gain (B) of the feedback loop (2), the laser output signal is amplitude-modulated at a frequency equal to the modulation frquency (f2) of the input signal.

12 Claims, 1 Drawing Sheet

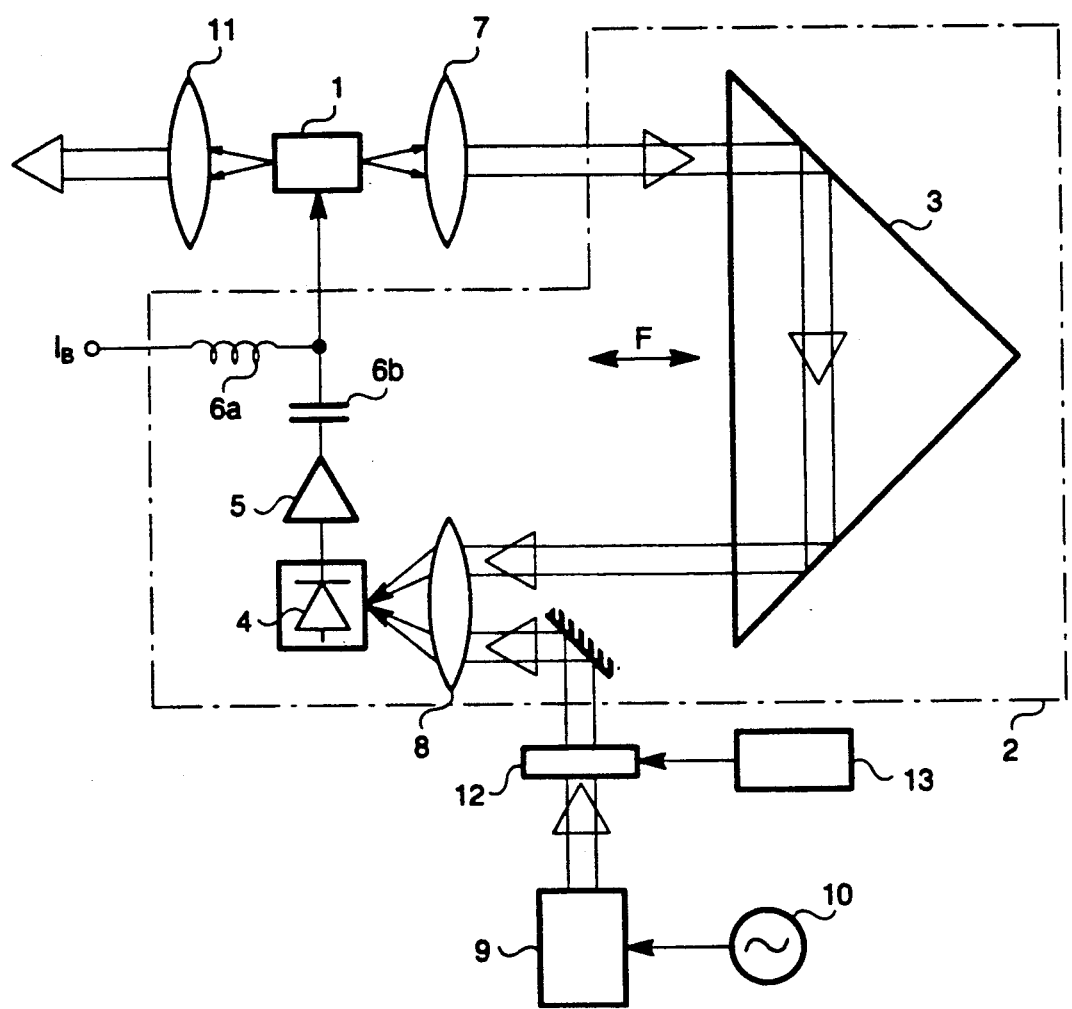

APPARATUS AND METHOD FOR THE GENERATION OF MODULATED OPTICAL SIGNALS USING A SEMICONDUCTOR LASER

FIELD OF THE INVENTION

The present invention relates to optical fiber communications systems exploiting radiofrequency or microwave-frequency subcarriers and, more particularly, to a method of and a device for generating amplitude-modulated optical signals for use in one of these systems.

BACKGROUND OF THE INVENTION

Optical communications systems of the above type are employed in broad-band distribution networks, e.g. in integrated services networks, and they use optical fibers as a broad-band transmission medium. Examples of these systems and of their applications are described by R. Oishansky, V. A. Lanzisera and P. M. Hill in the paper: "Subcarrier Multiplexed Lightwave Systems for Broad-Band Distribution", Journal of Lightwave Technology, Vol. 74, NO. 9, Sep. 1989, pages 1329 ff.

OBJECT OF THE INVENTION

The object of the present invention is to provide a method of and a device for generating amplitude-modulated optical signals for use in one of these systems.

SUMMARY OF THE INVENTION

In accordance with the invention a method is provided wherein to the bias current of a laser there are superimposed the variations of an electric signal obtained by combining and converting into electrical form a fraction of the laser output signal, delayed in an opto-electronic feedback loop having a low-frequency gain lower than but close to a critical value, and an external optical signal which is amplitude modulated at a first modulation frequency. The first modulation frequency belongs to a discrete set of frequencies at which the laser output intensity can be modulated owing to the presence of of the feedback loop and being the modulation frequency of said intensity when the variations of an electric signal resulting from conversion of the only feedback signal are superimposed to the bias current and the low-frequency gain is higher than that critical value.

The invention exploits a phenomenon observed by the inventors in a semiconductor laser with delayed opto-electronic feedback. Under these conditions the intensity of the beam emitted by the laser is amplitude modulated and oscillates at a frequency belonging to a discrete set of frequencies, which depend on delay $\tau$ and on low-frequency gain B of the feedback loop. More particularly delay $\tau$ determines the possible modulation frequencies, while the absolute value $|B|$ of gain B determines the actual modulation frequency. Depending on value $|B|$, two different laser operation regimens or modes exist: as long as $|B|$ is lower than a certain critical value Bc, the intensity of the beam emitted by the laser is modulated at a frequency f1 close to the frequency of laser relaxation oscillations; if on the contrary $|B|>Bc$, the oscillations take place at a frequency f2 which is the lowest frequency in the set and is $1/\tau$ or $1/2\tau$, depending on the sign of B. Under these conditions, the power of the laser output signal is very high. Modulation frequencies are generally comprised in the radio frequency or microwave frequency range.

The modulation obtained in this way has a very narrow spectral range.

A more detailed analysis of the behavior of the semiconductor laser with delayed opto-electronic feedback is reported by the inventors in the paper "instabilities in a semiconductor laser with delayed opto-electronic feedback", Optics Communications, Vol. 74, No. 1-2, 1st Dec. 1989.

Further studies are experiments have led the inventors to observe that when $|B|$ is slightly below Bc, the system becomes very sensitive to frequency f2 and, by injecting into the laser also a low-power signal amplitude modulated at frequency f2, the oscillation frequency of the laser output power passes from f1 to f2, and the output signal power is nevertheless very high and basically corresponds to the power obtained in case of oscillation at frequency f1 without any external signal. This high power of the laser output signal is due to the sum of two effects: the first is the amplification of the modulated signal due to the combined action of the detector, the laser and possible interposed amplification circuits, while the second is due to the presence of the feedback loop and is the one which mostly contributes to the attainment of this high power. The invention just exploits this effect, which for the sake of simplicity will be hereinafter referred to as "amplification effect" even though the output power is in effect independent of the input power.

According to another feature of the invention, also the fact that, for a given value of $|B|$, modulation takes place at two different frequencies according to whether or not an amplitude-modulated signal is injected, is exploited to obtain a frequency modulation effect joined to the amplification effect. To this end, the amplitude-modulated optical signal is combined with the feedback signal only at predetermined time intervals, to periodically switch the modulation frequency of the outgoing beam between the first frequency and a second frequency, which is the modulation frequency determined by that gain of the feedback loop in the absence of an external signal.

The invention further provides a device for performing the method, comprising:
 a semiconductor laser;
 an opto-electronic feedback loop, which is associated with the laser, is fed with a fraction of the laser output signal and has a presettable delay and a presettable low frequency gain, the gain having a value very close to but lower than a critical value;
 means for combining the fraction of the laser output signal with an optical input signal to be amplified, which is amplitude-modulated at a first modulation frequency (f2), which is a frequency belonging to a discrete set of frequencies at which the intensity of the laser output beam can be modulated owing to the presence of feedback loop and is the modulation frequency of the intensity in the absence of amplitude-modulation input signal and for a low-frequency gain higher than the critical value; and
 means for converting the optical signal resulting from that combination into an electrical signal, for superimposing the variations of the electrical signal to the bias current to the laser and for supplying the resulting signal to the semiconductor laser, to amplitude modulate its output signal at the same frequency as that of the input signal.

BRIEF DESCRIPTION OF THE DRAWING

The invention will be described in greater details with reference to the annexed drawing, the sole FIGURE of which schematically shows the device of the invention. In the drawing, the optical signal path is shown by double line arrows, and the electric signal path by single line arrows.

SPECIFIC DESCRIPTION

As shown, a semiconductor laser 1 biased by a direct current IB is associated with an opto-electronic feedback loop, denoted on the whole by 2, which is fed with the radiation emitted by one of the facets of laser 1, e.g. the front facet. The feedback loop comprises:

- a delay element 3, which introduces onto the signal a delay $\tau$ adjustable from the outside and is schematized here by a corner reflector which can be moved towards or away from laser 1, as shown by arrow F;
- a detector 4, converting the signal outgoing from delay element 3 into an electrical current;
- an amplifier 5 amplifying the detector output current and having a gain adjustable from the outside: for use in the present invention, the amplifier gain is adjusted so that low-frequency gain B of feedback loop 2 is slightly lower than the above-mentioned critical value Bc; and
- a circuit comprising e.g. an inductance 6a and a capacitor 6b connected to form a so-called 'bias-tee' as shown in the drawing, to superimpose the photo-detection current variations, originated by the usual fluctuations of the laser output signal due to whatever noise (e.g. quantum noise due the laser structure as well as thermal noise), to laser bias current Ib.

Lenses 7, 9 schematize the optical systems which allow the radiation emitted by the laser 1 and the radiation outgoing from delay element 3 to be sent to feedback circuit 2 and detector 4, respectively. Detector 4 receives, also through lens 8, a low-power amplitude-modulated optical signal, with modulation frequency equal to the above-defined frequency f2. That signal comes from a respective source 9. There are no particularly constraints for the wavelength of that signal, provided obviously that it lies within the range accepted by detector 4.

The devices which effect the amplitude modulation, obtained e.g. by means of a sinusoidal subcarrier at frequency f2 supplied by a generator 10, are incorporated in source 9. The way in which an optical beam can be amplitude modulated is well known to those skilled in the art.

The modulated optical signal is handled in the same way as the feedback signal, and hence not only the detector output current variations due to feedback signal fluctuations, but also those due to the amplitude modulation of the signal coming from source 9 will be superimposed upon bias current IB of laser 1. The amplified signal, amplitude modulated at frequency f2, will exit from the rear facet of laser 1 and will be collected by a lens 11 and sent to a receiver.

The device described can find different applications in the system above referred to. The following examples can be mentioned:

- the use as an oscillator at one of the frequencies determined by the delay and the gain of the feedback loop;
- the use as a narrow band amplifier (by injecting external low-power signals), with a center frequency which can be adjusted from the outside by acting on feedback loop delay;
- the use as an injection locked oscillator; and
- the use as a modulator for carrying out a frequency modulation, possibly joined with an amplification, in a binary-signal transmission system: actually the device switches between frequencies f2 and f1 according to whether it receives the modulated signal (bit 1) or not (bit 0); in this application, means will be necessary to periodically intercept the beam emitted from source 9 (e.g. an acousto-optical modulator 12 controlled by a square-wave signal supplied by a generator 13), as shown in the drawing, or the sinusoidal subcarrier can be electrically modulated by a binary signal.

Typical values for delay $\tau$ are of the order of a few nanoseconds, and typical values for Bc are between 1 and 2. The injected signal power depends on the laser characteristics; typical value may be of the order of 0.1 mW or even less. In an exemplary embodiment of the invention, in which source 1 was a commercial single mode laser and detector 4 was a commercial avalanche photodetector, Bc was 1.3 (approximately 2.5 dB), $\tau$ was 4 ns, and frequencies f1, f2 were 970 MHz and 234 MHz, respectively. In another embodiment, Bc was $-1.5$ (approximately 3.5 dB), $\tau$ was 5 ns, and frequencies f1, f2 were 660 MHz and 100 MHz, respectively. In both examples, B was set about 0.5 dB below Bc. The amplification effect obtained exceeded 20 dB.

It is clear that the embodiment described has been given by way of non-limiting example and that variations and modifications are possible without departing from the scope of the invention. More particularly the device can be implemented by integrated optics techniques, with modifications which are obvious to the skilled in the art. In this case delay $\tau$ may be much smaller than in case of of discrete components and hence the device can operate at correspondingly higher frequencies.

We claim:

1. A method of generating amplitude-modulated optical signals, comprising the steps of:
   (a) superimposing upon a bias current of a semiconductor laser variations of an electrical signal obtained by combining and converting into electrical form a fraction of an output signal of the laser; and
   (b) delaying said electrical signal with respect to said output signal in an opto-electronic feedback circuit having a presettable delay ($\tau$) and a presettable low frequency gain (b) lower than but close to a critical value (Bc), and an optical signal amplitude modulated at a first modulation frequency (f2), said frequency belonging to a discrete set of frequencies at which the intensity of the beam outgoing from the laser can be modulated owing to the presence of the feedback circuit and being the modulation frequency of said intensity when the variations of an electrical signal obtained by conversion of the only feedback signal are superimposed to the bias current and the low-frequency gain is higher than the critical value.

2. A method as claimed in claim 1, wherein said amplitude-modulated optical signal is combined with the feedback signal only at predetermined time intervals, to periodically switch the modulation frequency of the laser output signal between said first frequency (f2) and a second frequency (f1), which also belongs to said discrete set and is the modulation frequency of said intensity when the variations of an electrical signal obtained by conversion of the only feedback signal are superimposed to the bias current and the low frequency gain is lower than said critical value (Bc).

3. A device for generating amplitude-modulated optical signals, comprising:

a semiconductor laser;

an opto-electronic feedback loop, which is associated with said laser, is fed with a fraction of the laser output signal and having a presettable delay $\tau$ and a presettable low-frequency gain (B), said gain (B) having a value very close to but lower than a critical value (Bc);

means for combining said fraction of the laser output signal with an optical input signal to be amplified, which is amplitude-modulated at a first modulation frequency (f2), which is a frequency belonging to a discrete set of frequencies at which the intensity of the laser output can be modulated owing to the presence of the feedback loop and is the modulation frequency of said intensity in the absence of amplitude-modulated input signal and for a low-frequency gain of the feedback loop higher than said critical value (Bc); and means for converting the optical signal resulting from that combination into an electrical signal, for superimposing the variations of said electrical signal to the bias current (IB) of the laser and for supplying the resulting signal to the semiconductor laser, to amplitude modulate its output signal at the same frequency as that of the input signal.

4. A device as claimed in claim 3, further comprising means for periodically intercepting the amplitude-modulated input signal before it reaches the combining means, so as to modulate the output signal of the laser, during the periods in which the input signal is intercepted, at a second frequency (f1), which also belongs to said discrete set and is the frequency of oscillation of the intensity of the laser output signal when the only feedback signal is present and the gain of the feedback loop is lower than the critical value (Bc).

5. The device defined in claim 3, further comprising an optical system including at least one lens between said laser and said feedback loop.

6. The device defined in claim 5 wherein said feedback loop comprises a corner reflector shiftable along a path of a beam received from said optical system to adjust said delay.

7. The device defined in claim 6 wherein said feedback loop comprises a detector responsive to a beam reflected by said corner reflector, and another optical system including at least one lens between said corner reflector and said detector.

8. The device defined in claim 7 wherein said detector has an electrical output connected by a bias tee to a bias input of said laser.

9. The device defined in claim 8 wherein said bias current is applied to said bias tee.

10. The device defined in claim 9 wherein said bias tee comprises an inductor connected to a source of said bias current and a capacitor connected to said output of said detector.

11. The device defined in claim 7, further comprising a source of an optical signal of said frequency (f2) operatively connected to said other optical system for supplying said detector with said optical signal of said frequency (f2).

12. The device defined in claim 11, further comprising means for periodically intercepting said optical signal of said frequency (f2) ahead of said other optical system.

* * * * *